(12) United States Patent
Shin et al.

(10) Patent No.: US 10,734,890 B2
(45) Date of Patent: Aug. 4, 2020

(54) POWER CONVERSION DEVICE

(71) Applicant: NISSAN MOTOR CO., LTD., Yokohama-shi, Kanagawa (JP)

(72) Inventors: Kentaro Shin, Kanagawa (JP); Shigeharu Yamagami, Kanagawa (JP)

(73) Assignee: NISSAN MOTOR CO., LTD., Yokohama-shi (JP)

( * ) Notice: Subject to any disclaimer, the term of this patent is extended or adjusted under 35 U.S.C. 154(b) by 0 days.

(21) Appl. No.: 15/577,538

(22) PCT Filed: May 29, 2015

(86) PCT No.: PCT/JP2015/065587
§ 371 (c)(1),
(2) Date: Nov. 28, 2017

(87) PCT Pub. No.: WO2016/194050
PCT Pub. Date: Dec. 8, 2016

(65) Prior Publication Data
US 2018/0152098 A1 May 31, 2018

(51) Int. Cl.
| | |
|---|---|
| *H02M 1/14* | (2006.01) |
| *H02M 1/44* | (2007.01) |
| *H02M 7/00* | (2006.01) |
| *H02M 3/155* | (2006.01) |
| *H02M 7/48* | (2007.01) |
| *B60L 50/51* | (2019.01) |
| *H05K 7/14* | (2006.01) |
| *H05K 7/20* | (2006.01) |

(52) U.S. Cl.
CPC ............... *H02M 1/44* (2013.01); *H02M 1/14* (2013.01); *H02M 7/003* (2013.01); *B60L 50/51* (2019.02);
(Continued)

(58) Field of Classification Search
CPC .......... H02M 1/12; H02M 1/44; H02M 1/126; H02M 1/14; H02M 3/155; H02M 7/003;
(Continued)

(56) References Cited

U.S. PATENT DOCUMENTS 8,064,198 B2 * 11/2011 Higashidani ....... H05K 7/20927
165/104.19
2003/0161166 A1 8/2003 Mutoh
(Continued)

FOREIGN PATENT DOCUMENTS

| EP | 1 724 911 A2 | 11/2006 |
|---|---|---|
| EP | 2 782 237 A1 | 9/2014 |

(Continued)

*Primary Examiner* — Nguyen Tran
*Assistant Examiner* — Monica Mata
(74) *Attorney, Agent, or Firm* — Foley & Lardner LLP

(57) ABSTRACT

Provided is a power conversion device including: a power module provided between a first power-supply busbar that supplies a positive power source and a second power-supply busbar that supplies a negative power source; a first capacitor with one end thereof connected to the first power-supply busbar; a second capacitor with one end thereof connected to the second power-supply busbar; a grounding member connected between the opposite end of the first capacitor and the opposite end of the second capacitor; and a conductive member routed along at least one of the first power-supply busbar and the second power-supply busbar and connecting the grounding member and a ground potential.

9 Claims, 17 Drawing Sheets

(52) U.S. Cl.
CPC ..... *B60L 2210/40* (2013.01); *B60L 2270/147* (2013.01); *H02M 3/155* (2013.01); *H02M 7/48* (2013.01); *H05K 7/1432* (2013.01); *H05K 7/20927* (2013.01)

(58) Field of Classification Search
CPC .. H02M 7/48; H02J 3/01; Y02E 40/40; H05K 7/1432; H05K 7/20927; B60L 50/51; B60L 2210/40; B60L 2270/147
USPC .......................................................... 363/39
See application file for complete search history.

(56) References Cited

U.S. PATENT DOCUMENTS

| | | | |
|---|---|---|---|
| 2011/0249421 A1* | 10/2011 | Matsuo | B60K 6/445 361/821 |
| 2014/0084687 A1* | 3/2014 | Dent | H02M 7/53871 307/26 |
| 2014/0192577 A1 | 7/2014 | Shin et al. | |
| 2014/0218979 A1 | 8/2014 | Shin et al. | |
| 2014/0286070 A1 | 9/2014 | Shin et al. | |
| 2014/0306563 A1 | 10/2014 | Oyama et al. | |
| 2015/0280602 A1 | 10/2015 | Ichihara | |
| 2016/0094128 A1* | 3/2016 | Eckel | H02M 3/158 323/312 |

FOREIGN PATENT DOCUMENTS

| | | |
|---|---|---|
| JP | 2004-7888 A | 1/2004 |
| JP | 2004-187484 A | 7/2004 |
| JP | 2013-219919 A | 10/2013 |
| JP | 2014-50260 A | 3/2014 |
| JP | 2014-87107 A | 5/2014 |
| JP | 2014-117047 A | 6/2014 |
| WO | WO 2013/031405 A1 | 3/2013 |
| WO | WO 2013/047172 A1 | 4/2013 |
| WO | WO 2013/080698 A1 | 6/2013 |

\* cited by examiner

FIG. 9
(a)
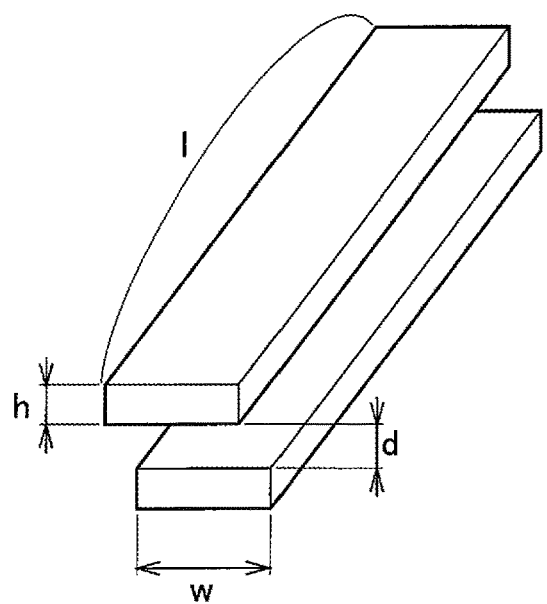
(b)
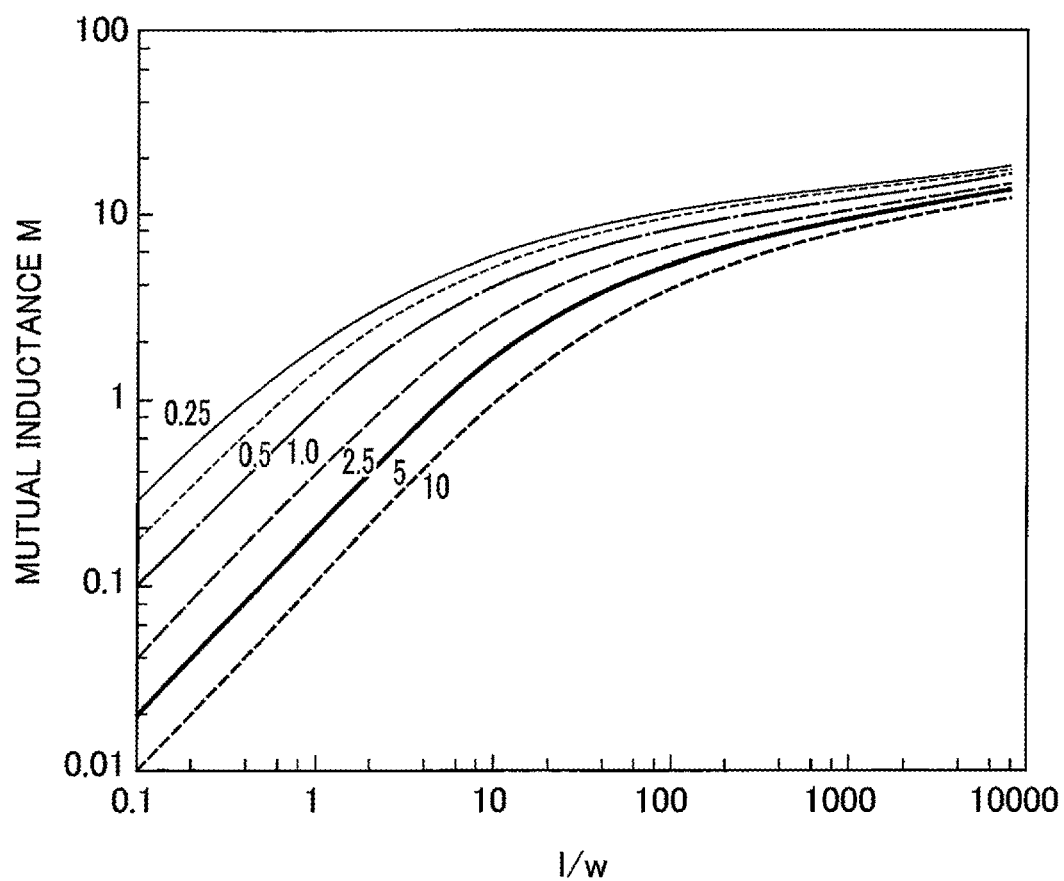

FIG. 18
(a)
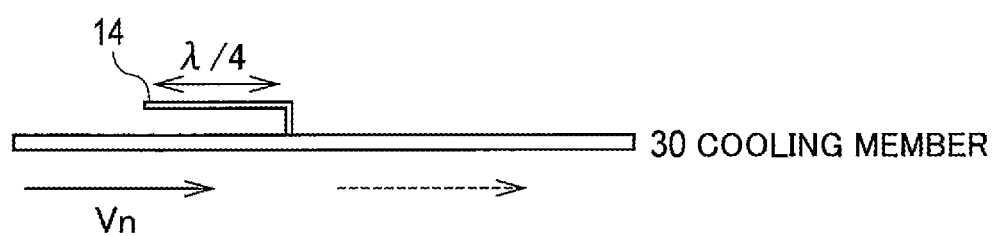
(b)
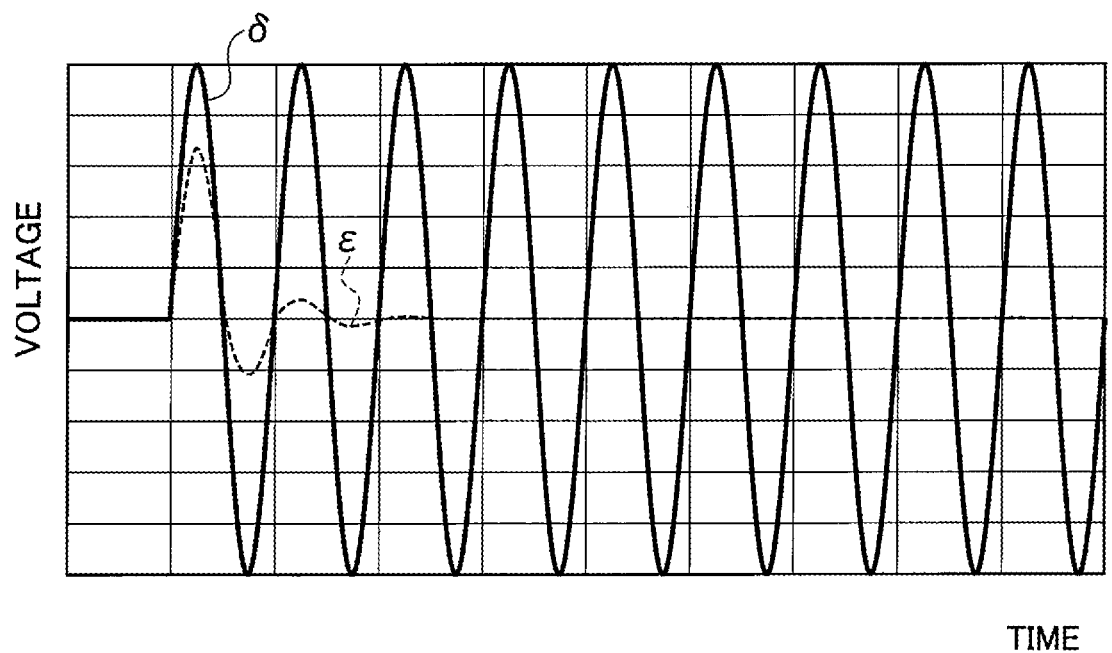

POWER CONVERSION DEVICE

TECHNICAL FIELD

The present invention relates to a power conversion device for converting a battery's DC power into AC power or converting the voltage of DC power.

BACKGROUND ART

Automotive power electronics systems for use in electric cars and hybrid cars are mainly constituted of a battery that supplies DC power, an inverter that performs DC-to-AC conversion, and a motor that obtains drive force from the electrical output of the inverter. The inverter in this case is a power conversion device.

The power conversion device incorporates switches formed of power semiconductor elements and, in the case of an inverter, converts DC power into AC power by opening and closing the switches and, in the case of a converter, converts the voltage by opening and closing the switches.

There are cases where the voltage fluctuation resulting from the opening and closing of the switches is radiated as a common mode noise and adversely affects the listening of the in-vehicle radio and other digital instruments. To solve this, in a conventional practice, a line that supplies power to the power conversion device and a grounding surface are connected by a capacitor to discharge the common mode noise to the ground potential (Patent Literature 1, for example).

CITATION LIST

Patent Literature

Patent Literature 1: Japanese Patent Application Publication No. 2004-7888

SUMMARY OF INVENTION

Technical Problem

However, there are cases where the common mode noise discharged to the ground potential leaks to the power conversion device's housing. This leads to a problem in that the channel through which the common mode noise leaks to the housing acts as an antenna, radiating unnecessary electromagnetic waves (radiation noise), and this radiation causes malfunction of other devices such as the in-vehicle radio.

The present invention has been made in view of the above problem, and an object thereof is to provide a power conversion device that allows reduction of the common mode noise leaking to its housing.

Solution to Problem

A power conversion device according to one aspect of the present invention includes a first power-supply busbar, a second power-supply busbar, a switching element, a first capacitor, a second capacitor, a grounding member, and a conductive member. The first power-supply busbar is arranged from the positive electrode side of a power source, the second power-supply busbar is arranged from the negative electrode side of the power source, and the switching element is provided between the first power-supply busbar and the second power-supply busbar. One end of the first capacitor is connected to the first power-supply busbar, and one end of the second capacitor is connected to the second power-supply busbar. The grounding member is connected between the opposite end of the first capacitor and the opposite end of the second capacitor. Moreover, in the power conversion device according to the present invention, the conductive member is routed along at least one of the first power-supply busbar and the second power-supply busbar and connected between the grounding member and a ground potential.

Part (a) of FIG. 9 illustrates the dimensions of two plate-shaped conductive bodies while part (b) of FIG. 9 is a graph illustrating tendencies of change in mutual inductance M with respect to these dimensions.

Figure 10:
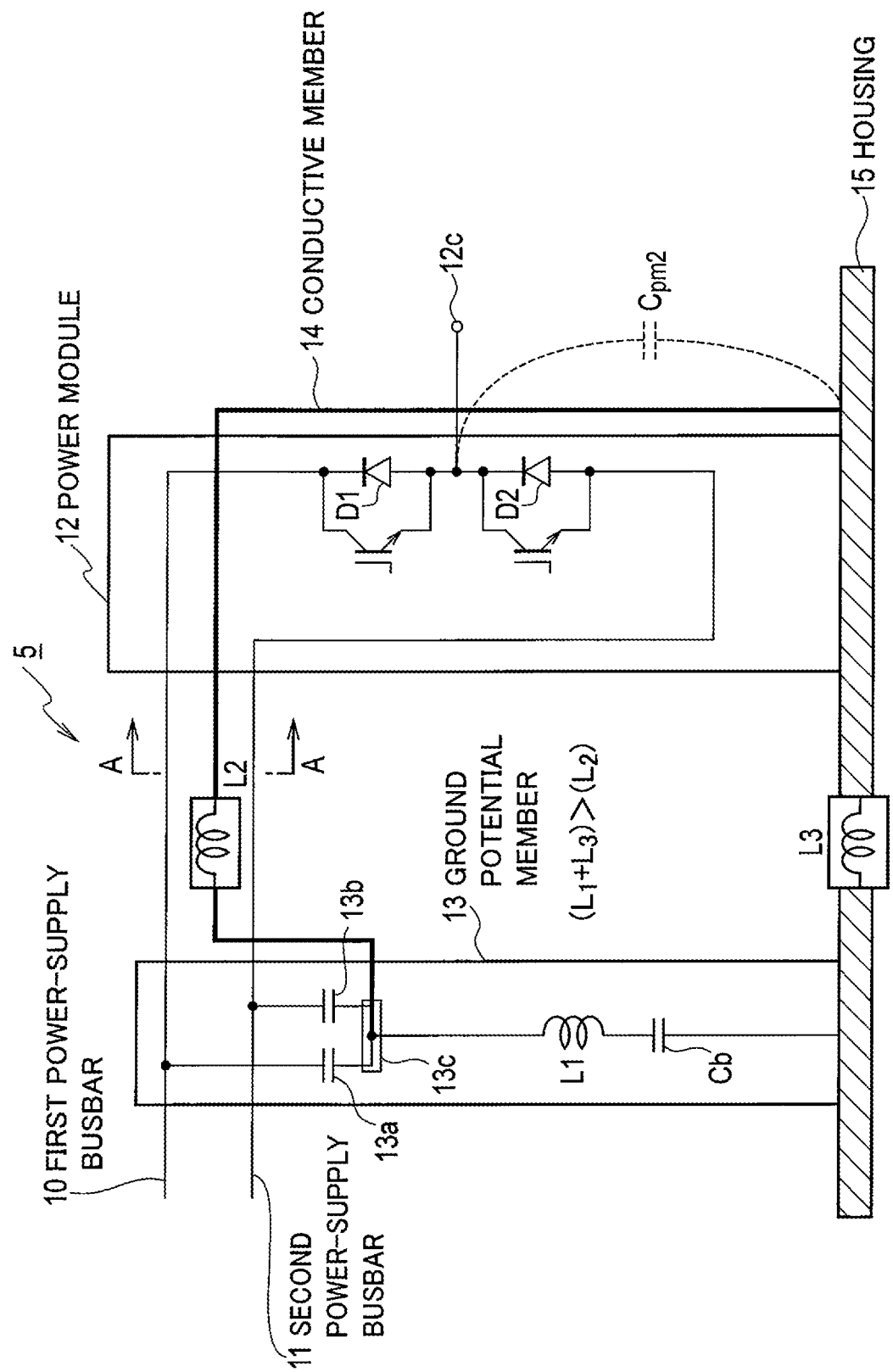

FIG. 10 is a diagram illustrating an example of the configuration of a power conversion device 5 in a fourth embodiment.

Figure 11:
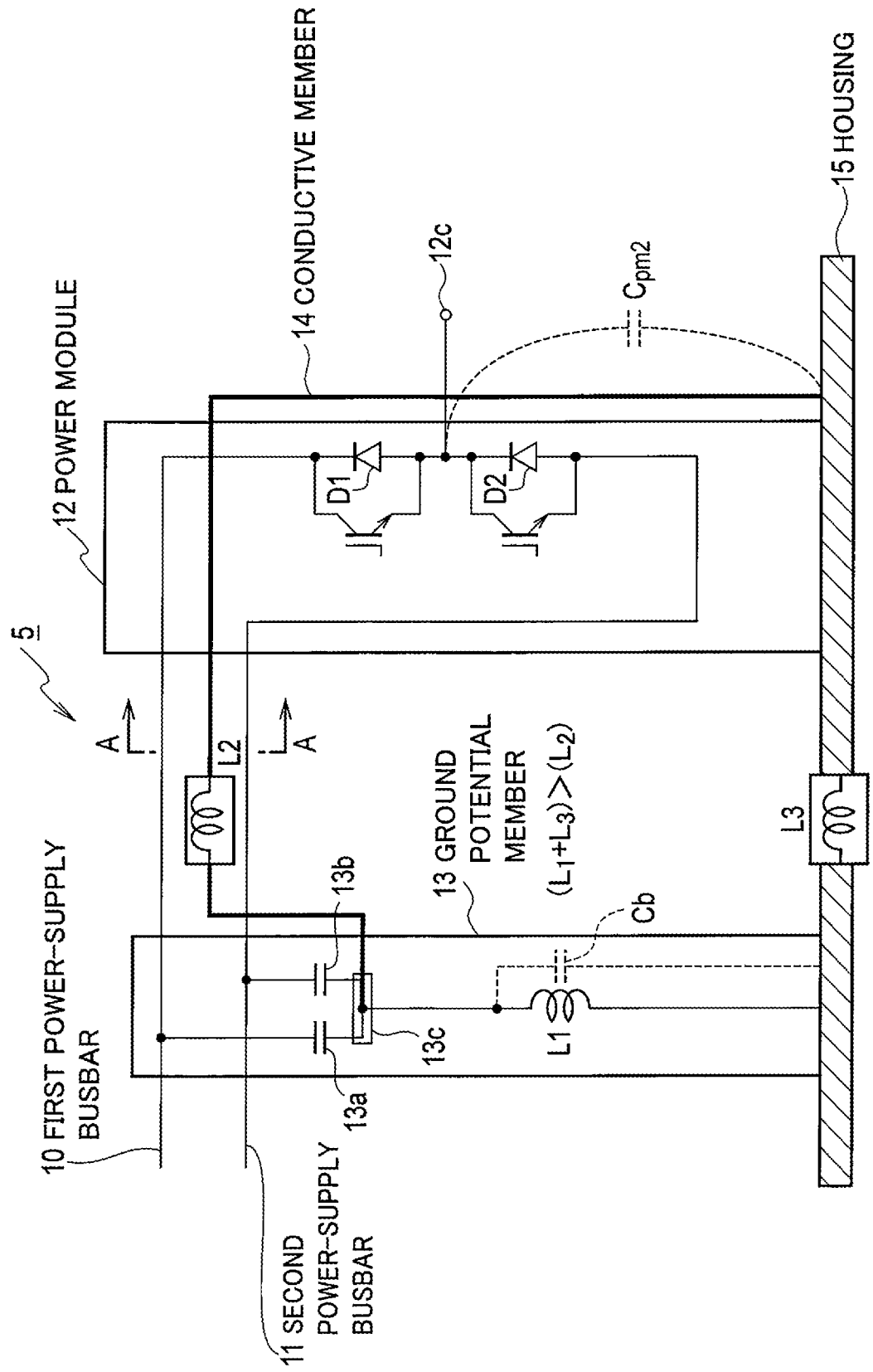

FIG. 11 is a diagram illustrating another example of the configuration of the power conversion device 5 in the fourth embodiment.

Figure 12:
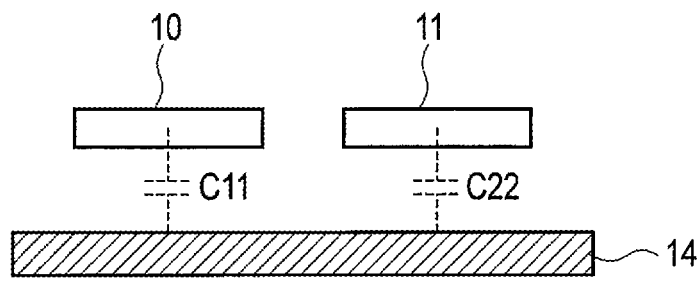

FIG. 12 is a cross-sectional view illustrating an example of the relation between a conductive member 14, a first power-supply busbar 10, and a second power-supply busbar 11 in their routed state.

Figure 13:
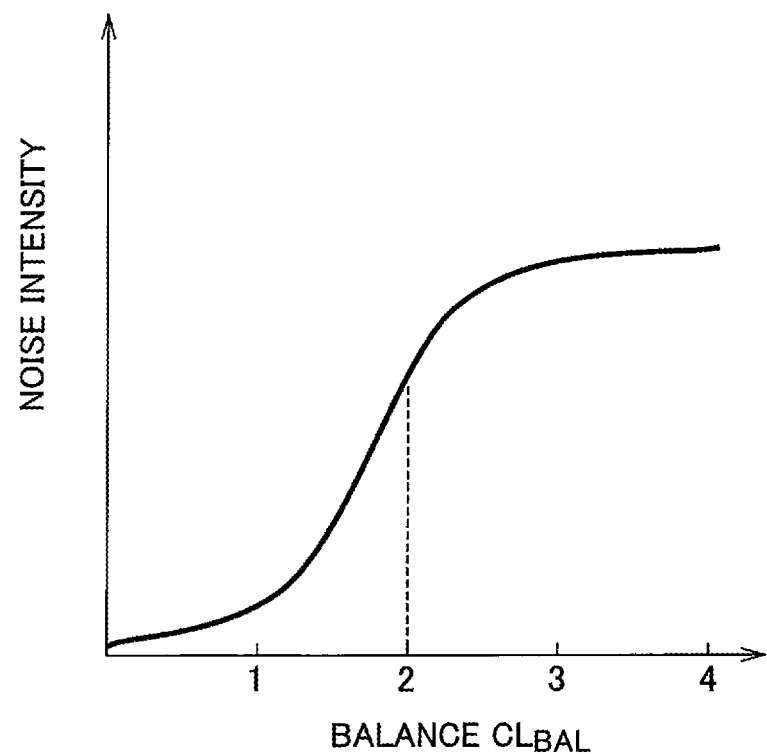

FIG. 13 is a graph illustrating the relation between balance $CL_{BAL}$ in electrical properties between the conductive lines (10, 11, 14) in FIG. 11 and the noise intensity of common mode noise.

Figure 14:
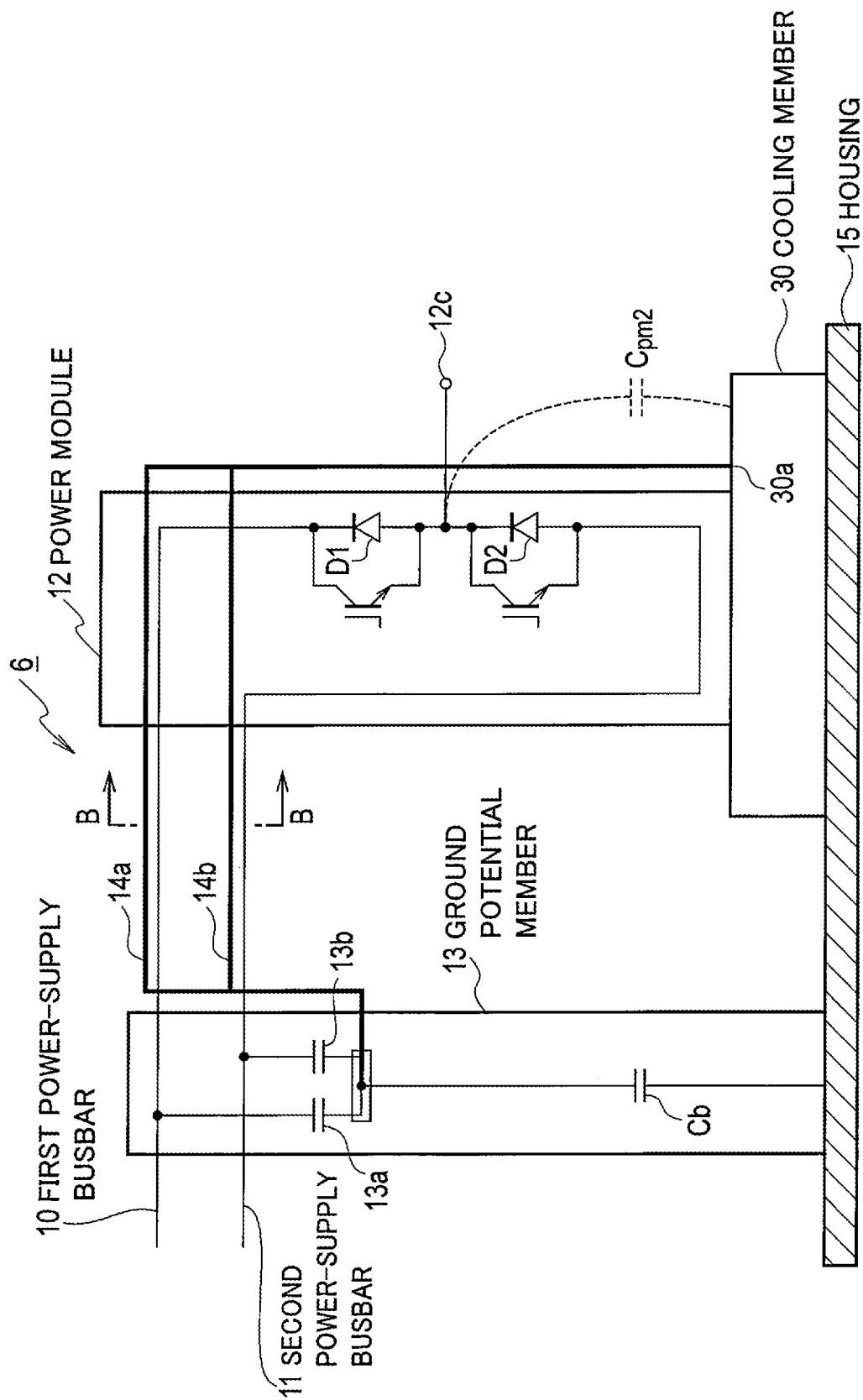

FIG. 14 is a diagram illustrating an example of the configuration of a power conversion device 6 in a fifth embodiment.

Figure 15:
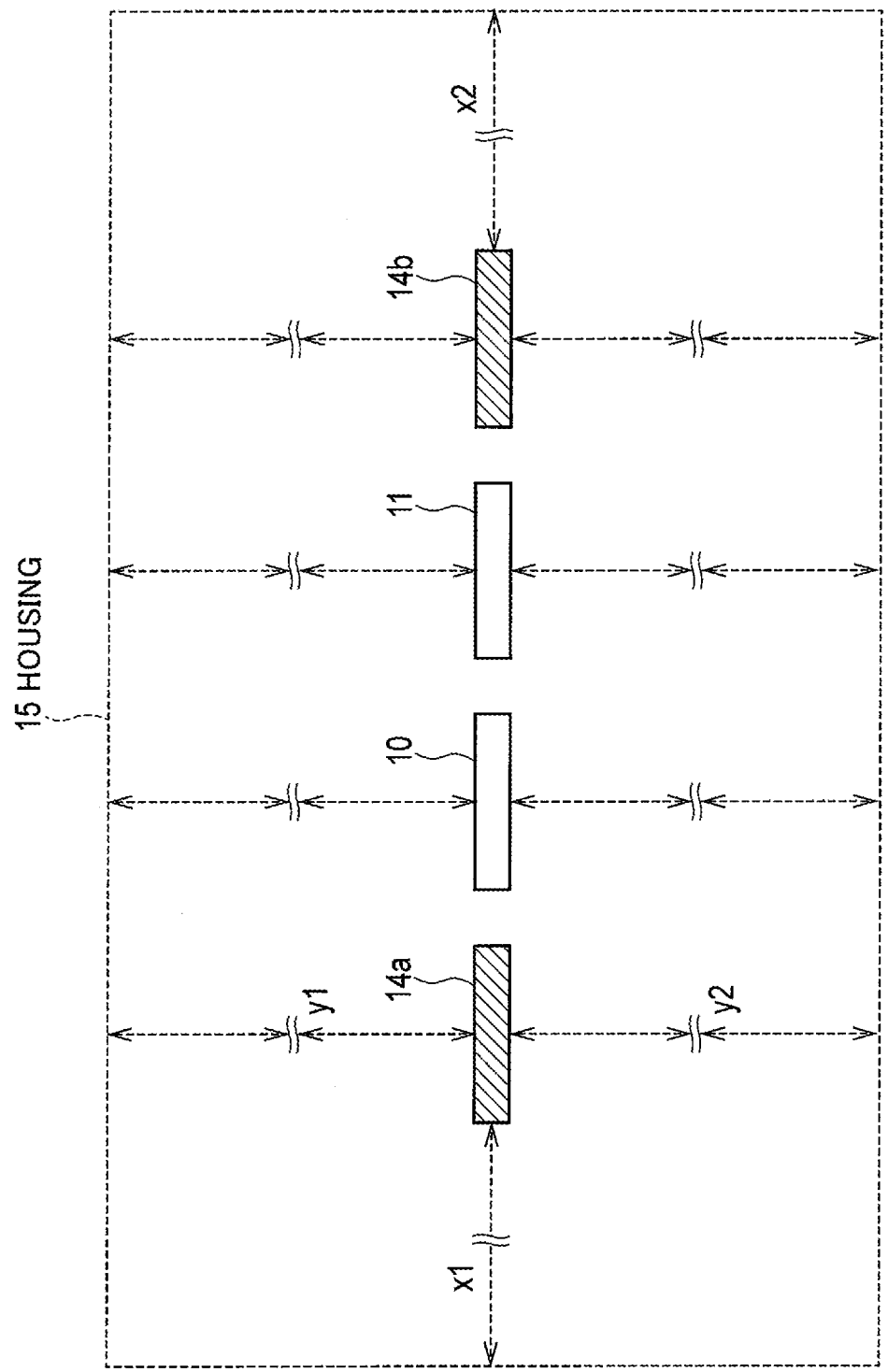

FIG. 15 is a cross-sectional view illustrating an example of the relation between conductive members 14a, 14b, the first power-supply busbar 10, and the second power-supply busbar 11 in their routed state.

Figure 16:
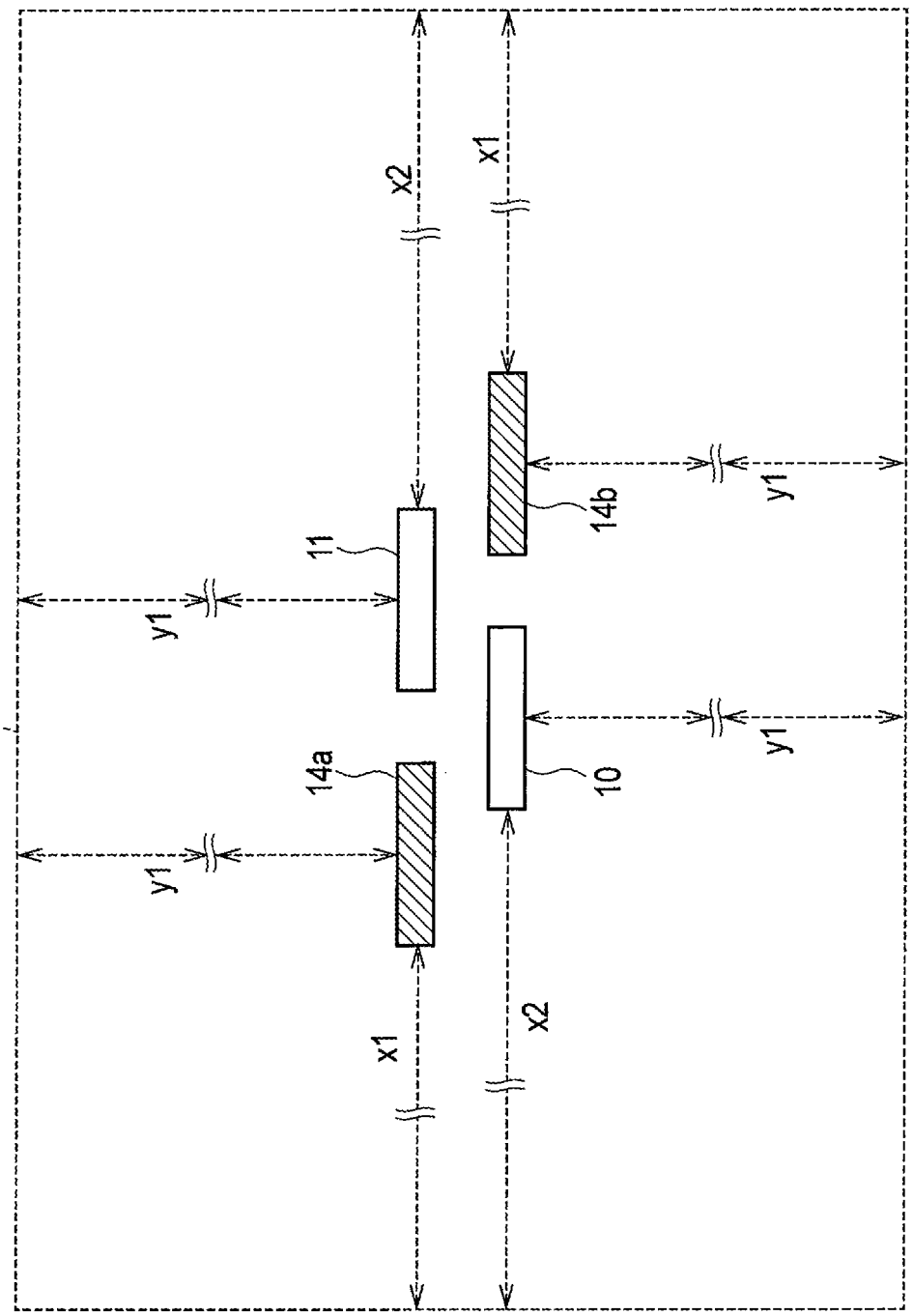

FIG. 16 is a cross-sectional view illustrating another example of the relation between the conductive members 14a, 14b, the first power-supply busbar 10, and the second power-supply busbar 11 in their routed state.

Figure 17:
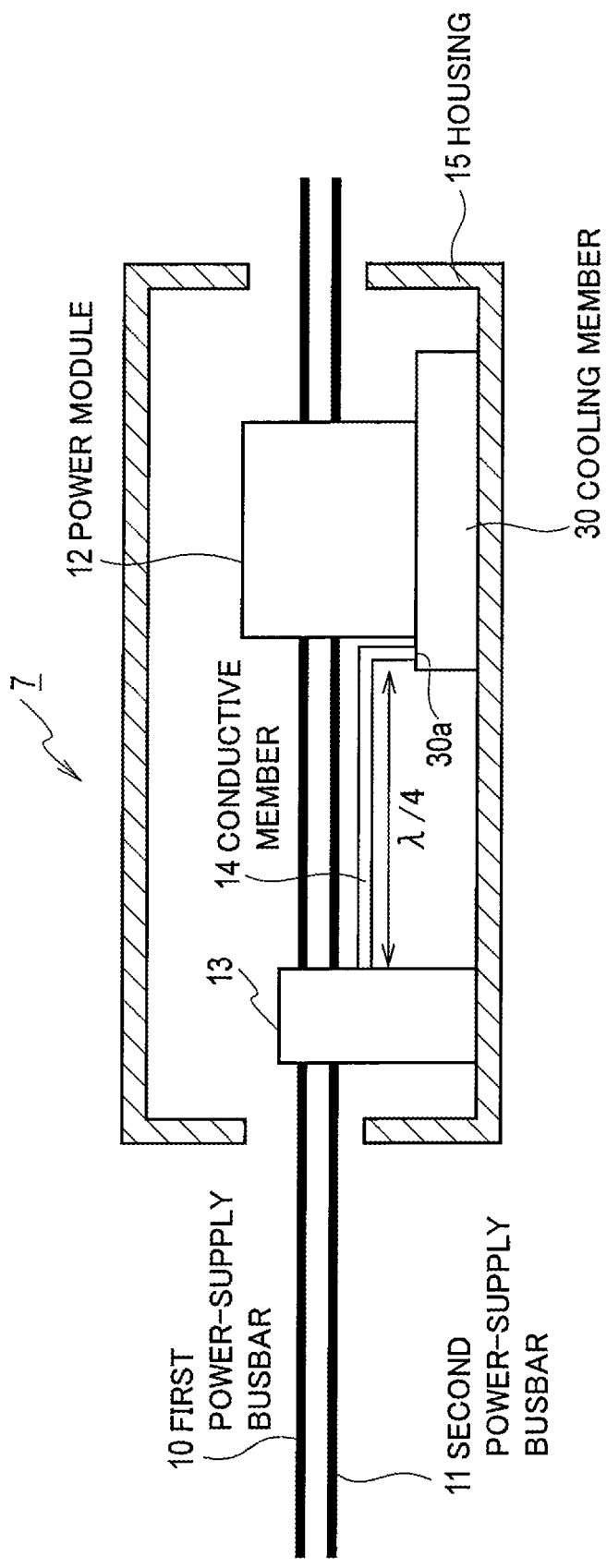

FIG. 17 is a diagram illustrating an example of the configuration of a power conversion device 7 in a sixth embodiment.

FIG. 18 is a set of diagrams explaining an operation and advantageous effect achieved by setting the length of the conductive member 14 to λ/4 of a wavelength λ of a high-frequency signal with a common mode voltage (current).

DESCRIPTION OF EMBODIMENTS

Embodiments will be described with reference to the drawings. Identical portions in the illustration of the drawings will be denoted by identical reference signs, and description thereof will be omitted.

First Embodiment

Figure 1:
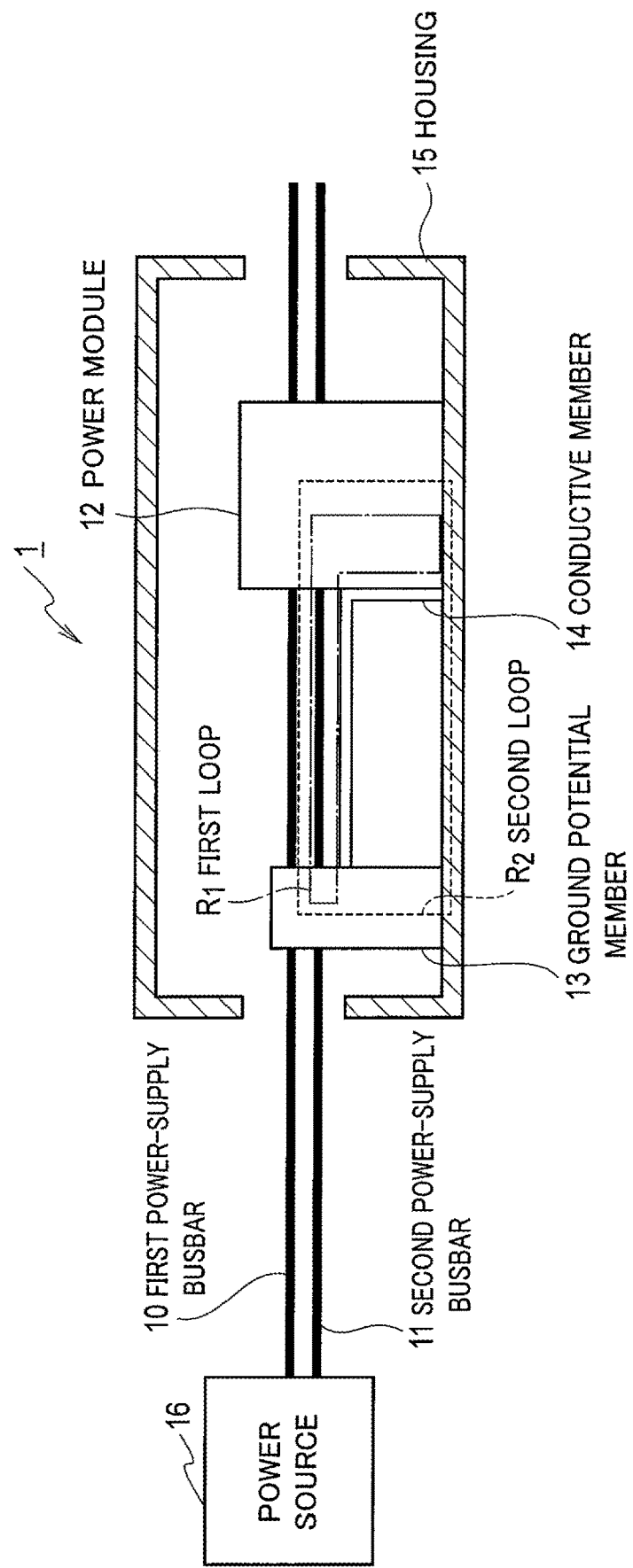
FIG. 1 is a diagram illustrating an example of the configuration of a power conversion device 1 in a first embodiment.

An example of the configuration of a power conversion device 1 in a first embodiment is illustrated in FIG. 1. The power conversion device 1 in this embodiment will be discussed with an example of an inverter that converts a battery's DC power into AC power in, for example, an automotive power electronics system.

The power conversion device 1 includes a first power-supply busbar 10, a second power-supply busbar 11, a power module 12 (switching element), a ground potential member 13, and a housing 15.

The first power-supply busbar 10 supplies the power conversion device 1 with a positive power source (positive electrode side) of a power source 16 (battery) that supplies DC power. The second power-supply busbar 11 supplies the power conversion device 1 with a negative power source (negative electrode side) of the power source 16. The first power-supply busbar 10 and the second power-supply busbar 11 can be arranged from any part of a power supply system.

The power module 12 is provided between the first power-supply busbar 10 and the second power-supply busbar 11 and is supplied with DC power from the power source 16. The power module 12 is, for example, an inverter that converts the DC power into AC power by repetitively opening and closing switches therein by means of a control signal, illustration of which is omitted.

The ground potential member 13 connects each of the first power-supply busbar 10 and the second power-supply busbar 11 and the housing 15, which is connected to a ground potential 19. This connection means an AC connection through reactance. Details will be described later.

A conductive member 14 is routed along at least one of the first power-supply busbar 10 and the second power-supply busbar 11 and connects the ground potential member 13 and the housing 15 near the power module 12. Thus, the first power-supply busbar 10 and the second power-supply busbar 11 are connected to the ground potential 19 by the ground potential member 13 and the conductive member 14.

Here, being "routed along" means that the conductive member 14 is extended by the side of at least one of the first power-supply busbar 10 and the second power-supply busbar 11, each of which is extended in the shape of a line, without leaving a large gap therebetween over a certain length. A specific example will be described later.

Now, common mode noise will be briefly described. The common mode noise is defined as a noise that propagates through lines inside a device in a common manner, a noises that propagates through a ground potential surface (grounded surface), or the like. More specifically, the common mode noise is a noise generated when the switching elements in the power module 12 are connected and disconnected, and flows through the first power-supply busbar 10 and the second power-supply busbar 11 in the same direction.

In the power conversion device 1, when the switches in the power module 12 are opened and closed, a common mode current flow which charges and discharges a stray capacitor between an output node of the power module 12, illustration of which is omitted in FIG. 1, and the ground potential 19. That common mode current flows through the first power-supply busbar 10 and the second power-supply busbar 11 simultaneously and flows through two channels—a first loop $R_1$ (dashed-dotted line) running through the conductive member 14 and a second loop $R_2$ (broken line) running through the housing 15.

The larger the stray capacitor between the output node and the ground potential 19, the larger the common mode current. The common mode current is a high-frequency wave, so that the channel for the common mode current flowing through the second loop $R_2$ may become a loop antenna and radiate unnecessary electromagnetic waves (common mode noise) from the housing 15.

The conductive member 14 in this embodiment is routed along at least one of the first power-supply busbar 10 and the second power-supply busbar 11. Thus, by the effect of a mutual inductance M therebetween, the inductance of the conductive member 14 can be made small. Consequently, the impedance of the conductive member 14 decreases, so that a common mode current, which is the source of the common mode noise, flows preferentially through the conductive member 14, thereby reducing the common mode current in the second loop $R_2$, which leaks to the housing 15 or the like. The mutual inductance M will be specifically described later.

As described above, the power conversion device 1 reduces the common mode current leaking to the housing 15 and therefore suppresses the radiation of unnecessary electromagnetic waves due to the common mode noise generated by that propagation channel. Note that the housing 15, which houses the power module 12 and other components, may not be provided. Instead of the housing 15, conductive lines or conductive plates may be used to ground the first power-supply busbar 10 and the second power-supply busbar 11. The operation of the power conversion device 1 in this embodiment will be specifically described below with reference to other drawings as well.

Figure 2:
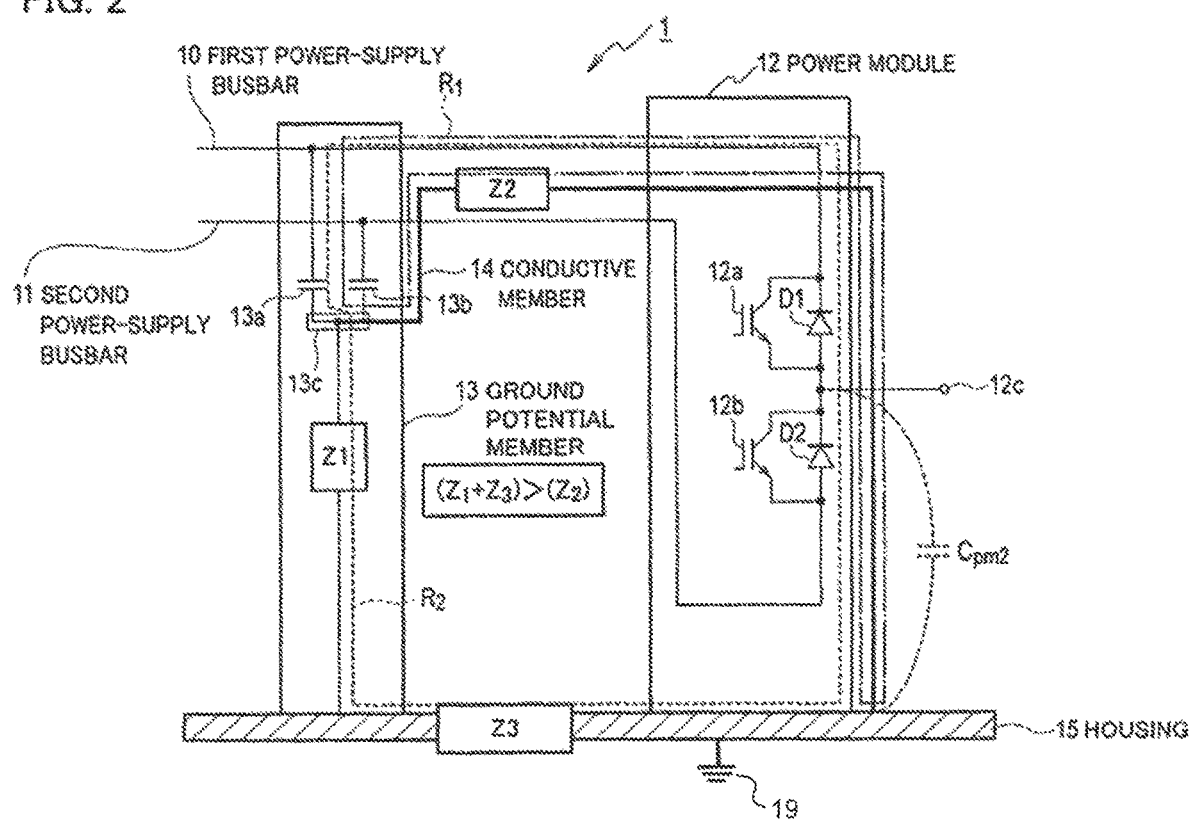
FIG. 2 is a diagram depicting the power conversion device 1 with circuit symbols.

A diagram depicting FIG. 1 with circuit symbols is illustrated in FIG. 2. The power module 12 illustrated in FIG. 2 represents an example of an inverter constituted, for instance, of a switching element 12a with its collector electrode connected to the positive power source and a switching element 12b with its emitter electrode connected to the negative power source. The emitter electrode of the switching element 12a and the collector electrode of the switching element 12b are connected to form an output node 12c. Diodes D1 and D2 are connected to the switching element 12a and the 12b respectively in an inverse-parallel configuration.

The ground potential member 13 is constituted of a first capacitor 13a, a second capacitor 13b, and a grounding member 13c. One end of the first capacitor 13a is connected to the first power-supply busbar 10. One of the second capacitor 13b is connected to the second power-supply busbar 11.

The opposite end of each of the first capacitor 13a and the second capacitor 13b is connected to the grounding member 13c, which is grounded. Although the grounding member 13c is depicted to be rectangular, the grounding member 13c may be of any shape.

The conductive member 14 connects the grounding member 13c and the inner side of the bottom of the housing 15 near the output node 12c of the power module 12. The conductive member 14 is routed along at least one of the first power-supply busbar 10 and the second power-supply busbar 11. Here, being near the output node 12c means being near a later-mentioned semiconductor chip in which the switching elements 12a, 12b are formed.

A stray capacitor $C_{pm2}$ is formed between this output node 12c and the housing 15, to which the conductive member 14 is connected. The common mode current that flows through the stray capacitor $C_{pm2}$ upon opening and closing the switching elements 12a, 12b flows through the first loop $R_1$, illustrated by the dashed-dotted line, and the second loop $R_2$, illustrated by the broken line. The common mode current also flows through the second power-supply busbar 11. Illustration of the common mode current flowing through the second power-supply busbar 11 is omitted as it would make it difficult to view the figure.

Figure 3:
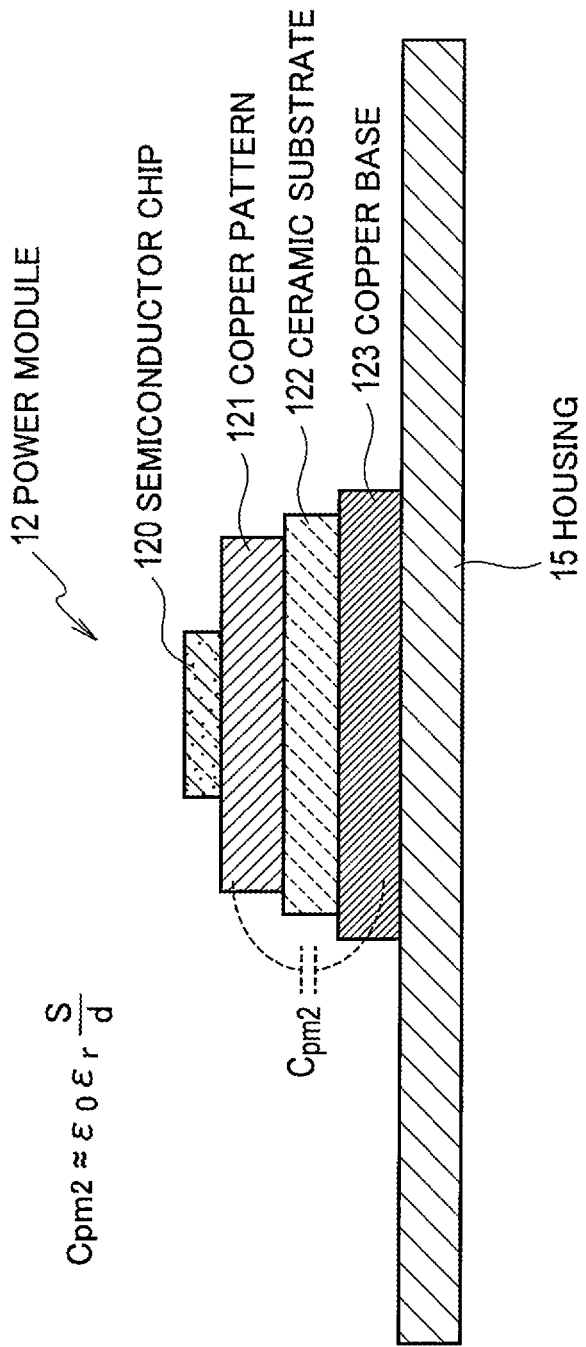
FIG. 3 is a diagram explaining a stray capacitor $C_{pm2}$ in the power conversion device 1.

The stray capacitor $C_{pm2}$, formed between the power module 12 and the housing 15, will be described with reference to FIG. 3. FIG. 3 illustrates the cross-sectional structure of the power module 12. The power module 12 includes, for example, a semiconductor chip 120 in which IGBTs (insulated gate bipolar transistors) and the like are formed, a copper pattern 121 on which that semiconductor chip 120 is mounted, a ceramic substrate 122 to which the copper pattern 121 is wired, and a copper base 123 fixing the ceramic substrate 122.

The capacitance of the stray capacitor $C_{pm2}$ between the output node 12c of the power module 12 and the ground potential is calculated using the following equation between the copper pattern 121 and the copper base 123.

[Math. 1]

$$C \approx \varepsilon_0 \varepsilon_r \frac{S}{d} \quad (1)$$

where S is the surface area of the portions of the copper pattern 121 and the copper base 123 facing each other, d is the distance between the copper pattern 121 and the copper base 123, and $\varepsilon_r$ is the relative permittivity of the ceramic substrate 122.

The first loop $R_1$ is a channel running through the first power-supply busbar 10, the second power-supply busbar 11, the first capacitor 13a, the second capacitor 13b, and the conductive member 14. The second loop $R_2$ is a channel running through the first power-supply busbar 10, the second power-supply busbar 11, the first capacitor 13a, the second capacitor 13b, the grounding member 13c, and the housing 15 via a capacitor floating at the location of the grounding member 13c or via the ground potential member 13.

Here, the impedance between the grounding member 13c and the housing 15 is defined as $Z_1$. The impedance $Z_1$ contains the reactance resulting from the capacitor floating by the grounding member 13c and the reactance resulting from the inductance of the ground potential member 13. Also, the impedance of the conductive member 14 is defined as $Z_2$. Moreover, the impedance of the housing 15 is defined as $Z_3$. By routing the conductive member 14 along at least one of the first power-supply busbar 10 and the second power-supply busbar 11, the power conversion device 1 holds these impedances in the relation described by the following inequality to reduce the common mode current leaking to the housing 15.

[Math. 2]

$$(Z_1+Z_3)>(Z_2) \quad (2)$$

Figure 4:
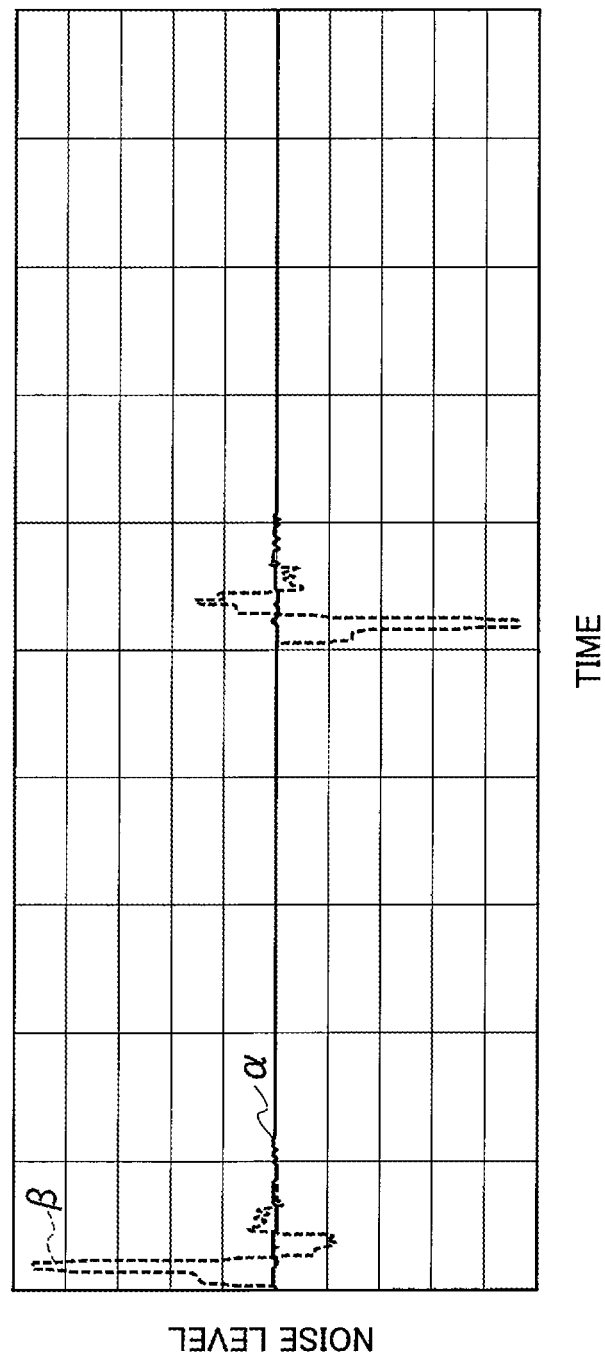
FIG. 4 is a graph illustrating examples compared with each other in common mode noise.

An example compared in common node noise with a case without employing this embodiment is illustrated in FIG. 4. FIG. 4 illustrates examples of the common mode noise leaking to the housing 15. The horizontal axis of FIG. 4 represents time while the vertical axis represents the noise level.

A waveform β (broken line) illustrated in FIG. 4 indicates the level of the noise leaking to the housing of the power conversion device in the comparative example. As a comparison with the noise level in the comparative example, the level of the noise leaking to the housing 15 of the power conversion device 1 in this embodiment is indicated by a waveform α (solid line). As demonstrated, the power conversion device 1 in this embodiment reduces the noise level by reducing the common mode current leaking to the housing 15.

Modification

Figure 5:
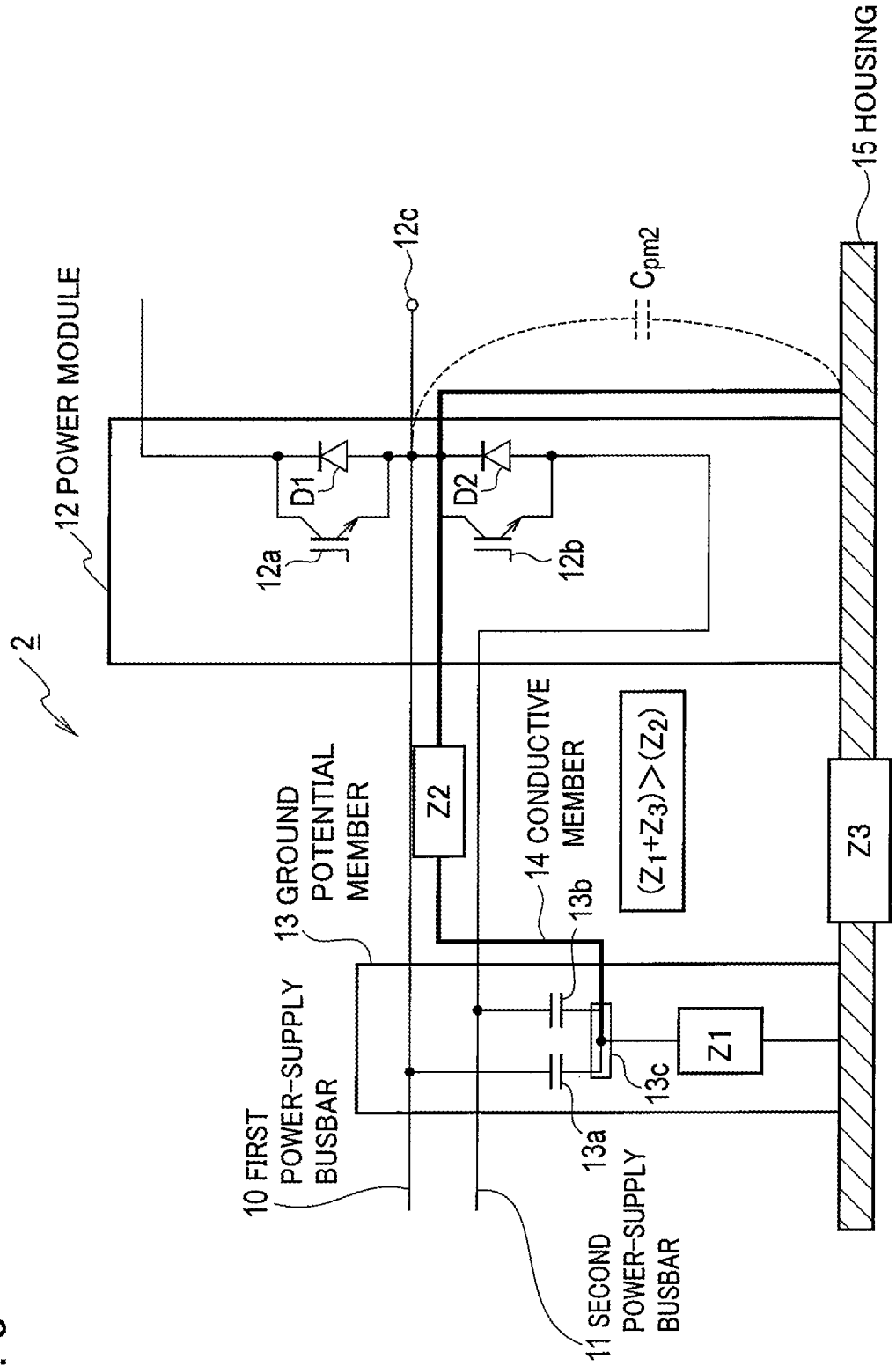
FIG. 5 is a diagram illustrating an example of the configuration of a power conversion device 2, which is the power conversion device 1 modified into a converter.

An example of modifying this embodiment into a boost converter is illustrated in FIG. 5. FIG. 5 illustrates an example of the configuration of a power conversion device 2 for converting (boosting) the voltage of the power source 16 to higher voltage.

FIG. 5 differs from the configuration in the FIG. 2, discussed with an example of an inverter, in that the first power-supply busbar 10 is connected to the output node 12c, to which the emitter electrode of the switching element 12a and the collector electrode of the switching element 12b are connected. In this case, the collector electrode of the switching element 12a is a boosted output.

Thus, the above-described idea can be applied to a converter. Specifically, by making the impedance $Z_2$ of the first loop $R_1$, in which a common mode current flows, smaller than the impedance $(Z_1+Z_3)$ of the second loop $R_2$, which covers the housing 15, the power conversion device 2 can reduce the common mode current leaking to the housing 15.

Second Embodiment

Figure 6:
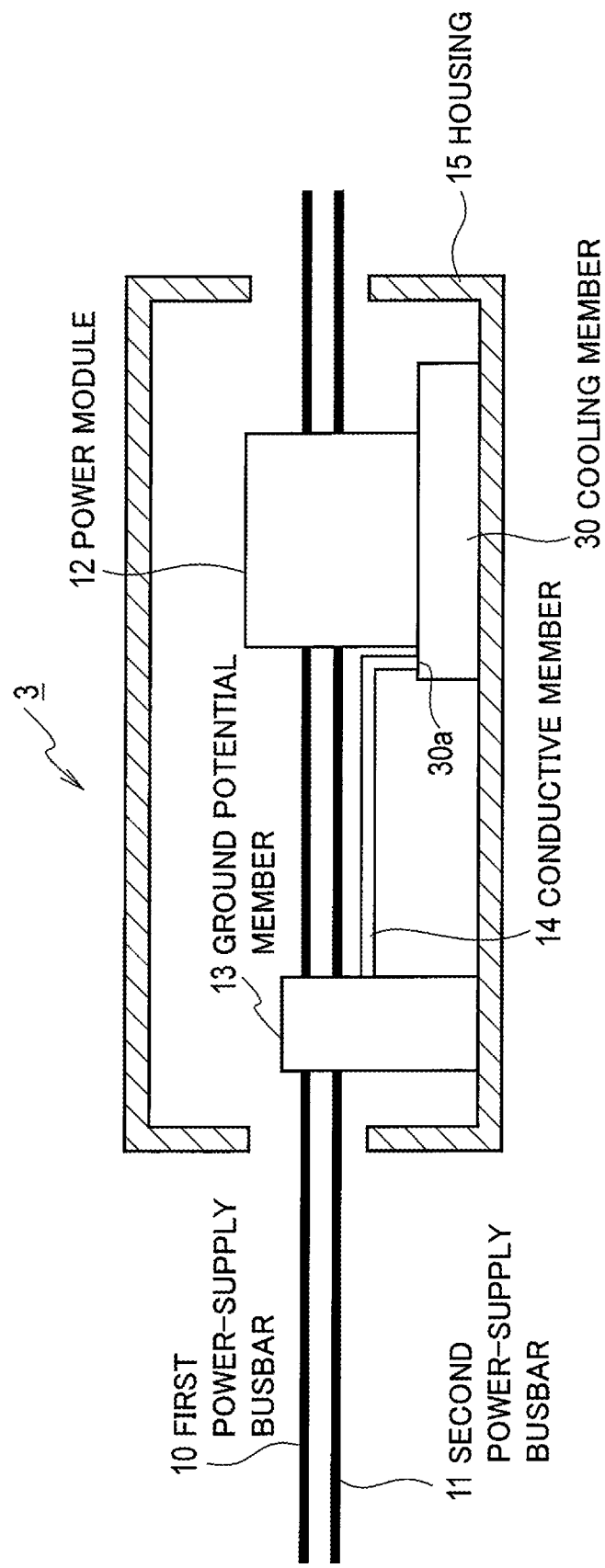
FIG. 6 is a diagram illustrating an example of the configuration of a power conversion device 3 in a second embodiment.

An example of the configuration of a power conversion device 3 in a second embodiment is illustrated in FIG. 6. The power conversion device 3 in this embodiment differs from the power conversion device 1 (FIG. 1) in that a cooling member 30 is included.

The power conversion device 3 may be cooled by the cooling member 30 since the power module 12 generates heat. The cooling member 30 is insulated from the power module 12 and disposed near it. For example, the cooling member 30 is disposed between the copper base 123 and the housing 15 in FIG. 2.

The surface of the cooling member 30 is grounded and has a portion 30a to which the conductive member 14 is connected. The portion 30a is provided at a surface of the cooling member 30 closer to the power module 12 than to the housing 15.

The portion 30a is present at a position above the bottom of the housing 15 and close to the power module 12. Accordingly, the length of the conductive member 14, connecting the portion 30a and one end of the grounding member 13c, can be shorter than the shortest distance from the ground potential member 13 to the portion 30a through the housing 15. This means that the $Z_3$, or the impedance of the housing 15, is made larger in a relative sense.

Figure 7:
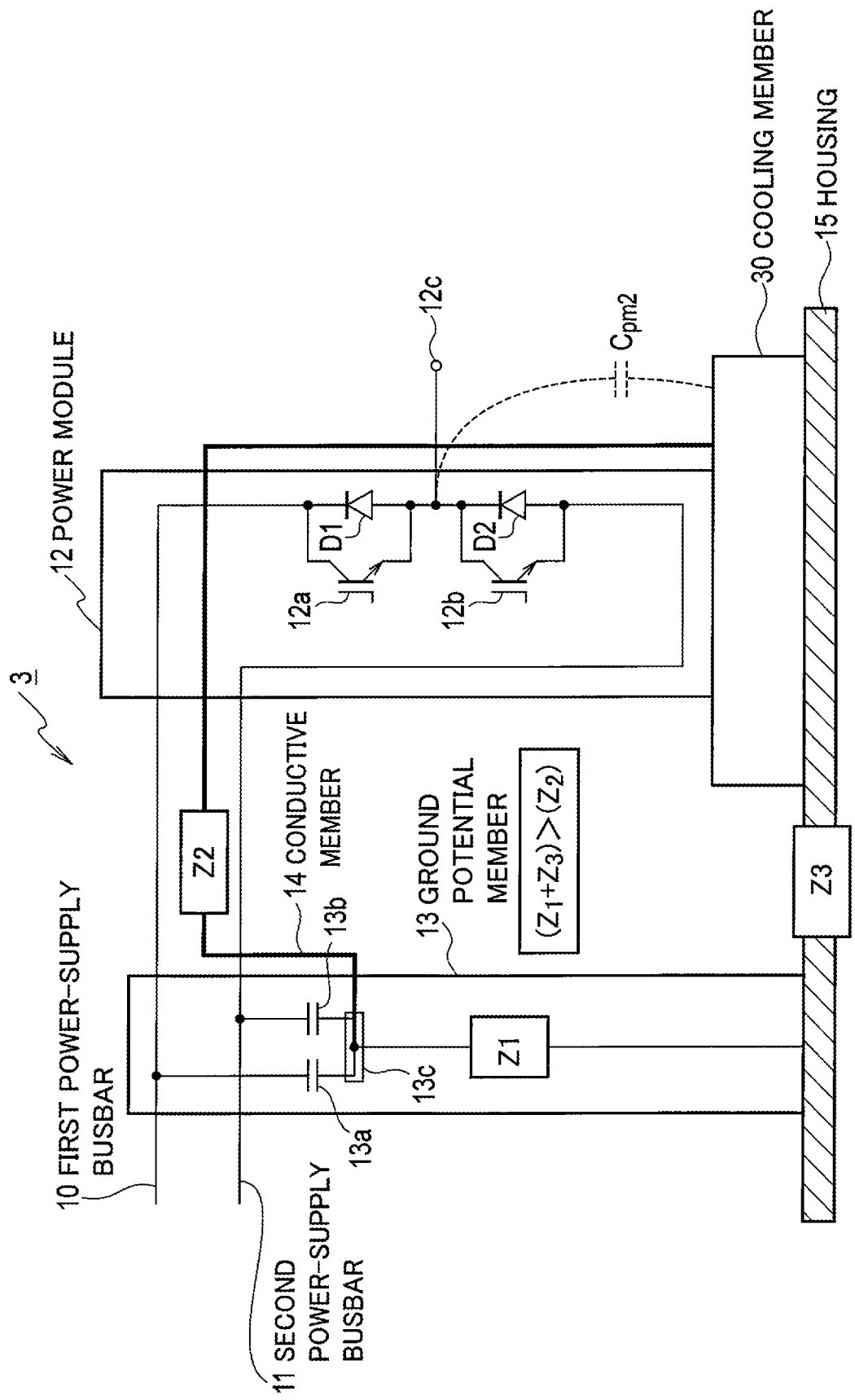
FIG. 7 is a diagram depicting the power conversion device 3 with circuit symbols.

A diagram depicting FIG. 6 with circuit symbols is illustrated in FIG. 7. FIG. 6 differs from FIG. 2 only in that the cooling member 30 is included. The cooling member 30 is inserted and disposed between the power module 12 and the housing 15. This can make the length of the conductive member 14 shorter than that in FIG. 2, that is, intensifies a relation of $Z_3 > Z_2$.

As described above, the power conversion device 3 intensifies the relation of the above-mentioned inequality (1) and therefore further reduces the common mode current leaking to the housing 15. Moreover, connecting the conductive member 14 to the portion 30a of the cooling member 30 eliminates the need for an exclusive member for ensuring the ground potential for the conductive member. Hence, the power conversion device 3 offers the advantage of reducing the number of members and also the advantage of easily ensuring the ground potential for the conductive member 14.

Third Embodiment

Figure 8:
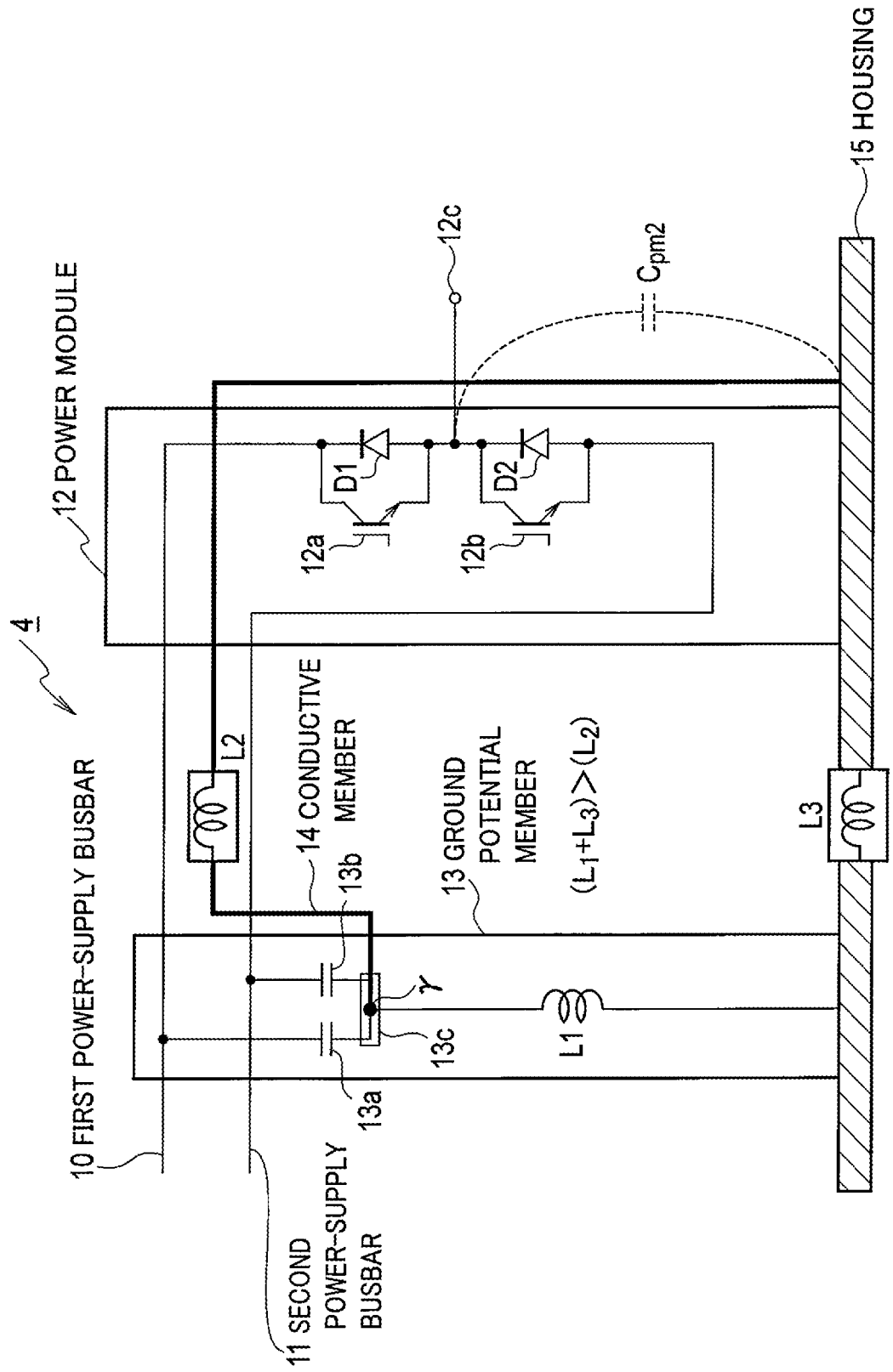
FIG. 8 is a diagram illustrating an example of the configuration of a power conversion device 4 in a third embodiment.

An example of the configuration of a power conversion device 4 in a third embodiment is illustrated in FIG. 8. The configuration of the power conversion device 4 in this embodiment is the same as the power conversion device 1 (FIG. 2).

The power conversion device 4 differs from the power conversion device 1 in that the power conversion device 4 is configured such that, with the impedances of the ground potential member 13, the conductive member 14, and the housing 15 replaced with inductances L1, L2, L3, the relation between these inductances can be expressed by inequality (3). The common mode current leaking to the housing 15 is reduced by making the inductance L2 of the conductive member 14 smaller than the sum of the inductances of the ground potential member 13 and the housing 15 (L1+L3). Note that the inductances L1, L2, L3 are not lumped constants.

[Math. 3]

$$(L_1 + L_3) > (L_2) \quad (3)$$

The inductance of each of the ground potential member 13 and the conductive member 14 that can be obtained in a case where its cross-sectional shape is, for example, a plate shape, is described in equation (4), where l is the length of the plate-shaped conductive body, h is the thickness of the plate-shaped conductive body, w is the width of the plate-shaped conductive body, and $\mu_0$ is the magnetic permeability.

[Math. 4]

$$L \approx \frac{\mu_0 l}{2\pi} \left[ \ln\left(\frac{2l}{w+H}\right) + \frac{1}{2} + \frac{0.2235(w+H)}{l} \right] \quad (4)$$

The mutual inductance M between the conductive member 14 and the first power-supply busbar 10 and the mutual inductance M between the conductive member 14 and the second power-supply busbar 11 can be calculated by the following equation. In Part (a) of FIG. 9 is illustrated the dimensions of the two plate-shaped conductive bodies routed over one another with a distance d therebetween. One of the conductive bodies has a width w, a thickness h, and a length l. The other conductive body has the same width and thickness, and is routed facing the one conductive body with the distance d therebetween. Tendencies of change in the mutual inductance M between these two conductive bodies are illustrated in part (b) of FIG. 9.

[Math. 5]

$$M \approx \frac{\mu_0 l}{2\pi} \left[ \ln\left(\frac{2l}{d}\right) - 1 + \frac{d}{l} \right] \quad (5)$$

The horizontal axis of part (b) of FIG. 9 represents the ratio of the length l of the conductive body to the width w (l/w), and the vertical axis represents the mutual inductance M. Moreover, each parameter (0.25, 0.5, 1.0, 2.5, 5, 10) represents the ratio of the distance d to the width w (d/w). Also, the ratio of the thickness h of the conductive body to the width w (h/w) is fixed at 0.25. The mutual inductance M increases the longer the length l of the conductive body (the larger l/w). Also, the mutual inductance M increases the larger the width w of the conductive body and the shorter the distance d between the conductive bodies (the smaller d/w).

The relations illustrated in part (b) of FIG. 9 indicate that shortening the distance between the conductive member 14 and the first power-supply busbar 10 or between the conductive member 14 and the second power-supply busbar 11 can increase the value of the mutual inductance M therebetween. If in-phase currents due to the common mode noise flow through the first power-supply busbar 10 and the second power-supply busbar 11 in the state where the distance between the conductive member 14 and the first power-supply busbar 10 or the second power-supply busbar 11 is short, differential currents flow through the first power-supply busbar 10 or the second power-supply busbar 11 and the conductive member 14. In the case where these differential currents flow, the inductance of the conductive member 14 can be reduced by the effect of the mutual inductance M. Consequently, the impedance of the conductive member 14 is reduced. This makes it possible to reduce the leaking common mode current.

In sum, the mutual inductance M between the conductive member 14 and the first power-supply busbar 10 or the second power-supply busbar 11 can be made large by routing the conductive member 14 along at least one of the first power-supply busbar 10 and the second power-supply busbar 11. Consequently, a common mode current can be caused to flow preferentially through the conductive member 14, thereby reducing the common mode current leaking to the housing 15. Therefore, the power conversion device 4 suppresses the radiation of unnecessary electromagnetic waves due to the common mode noise.

Note that while it is preferable to connect the conductive member 14 to a center portion of the grounding member 13c, the configuration is not necessarily limited to this; the conductive member 14 may be connected to a portion of the grounding member 13c other than its center portion as long as the conductive member 14 is routed along at least one of the first power-supply busbar 10 and the second power-supply busbar 11.

In sum, by routing the conductive member 14 along at least one of the first power-supply busbar 10 and the second power-supply busbar 11, the inductance of the conductive member 14 can be made smaller than the inductance of the grounding member 13c regardless of which portion the conductive member 14 is connected to. Consequently, a common mode current, which is the source of the common mode noise, can be caused to flow preferentially through the conductive member 14.

Fourth Embodiment

An example of the configuration of a power conversion device 5 in a fourth embodiment is illustrated in FIG. 10. In the power conversion device 5 in this embodiment, a capacitor floating between the grounding member 13c and the housing 15 of the power conversion device 4 (FIG. 8) is defined as $C_b$.

With $C_b$ as the capacitor between the grounding member 13c and the housing 15, the above-mentioned inequality (3) can be expressed as the following inequality. By satisfying the following inequality, the power conversion device 5 can reduce the leakage of the common mode current in a particular frequency band to the housing 15.

[Math. 6]

$$\left(2\pi f L_1 + 2\pi f L_3 + \frac{1}{2\pi f C_b}\right) > (2\pi f L_2) \quad (6)$$

Note that while the stray capacitor $C_b$ is illustrated in FIG. 10 to be connected in series to the inductance L1 of the ground potential member 13, the configuration is not necessarily limited to this; the stray capacitor $C_b$ may be depicted to be connected in parallel to the inductance L1, as illustrated in FIG. 11.

Also, as illustrated in FIG. 12, in the power conversion device 5, the conductive member 14 is routed along the first power-supply busbar 10 and the second power-supply busbar 11 such that the distance between the conductive member 14 and the first power-supply busbar 10 and the distance between the conductive member 14 and the second power-supply busbar 11 are equal to each other. FIG. 12 is a cross-sectional view taken along the direction perpendicular to the direction of extension of each conductive line (10, 11, 14) (corresponding to the A-A cross section in FIG. 10). FIG. 12 represents an example where the shape of each conductive line (10, 11, 14) is a flat plate shape and the first power-supply busbar 10 and the second power-supply busbar 11 are each routed with its one surface facing one surface of the conductive member 14.

By routing each conductive line (10, 11, 14) as in this example, a line-to-line capacitance C11 between the first power-supply busbar 10 and the conductive member 14 and a line-to-line capacitance C22 between the second power-supply busbar 11 and the conductive member 14 are made even. With L11 as the inductance of the first power-supply busbar 10 and L22 as the inductance of the second power-supply busbar 11, balance $CL_{BAL}$ in electrical properties between the conductive lines can be expressed by the following equation.

[Math. 7]

$$CL_{BAL} = \left|\frac{C11 - C22}{C11 + C22}\right| \times \left|\frac{L11 - L22}{L11 + L22}\right| \quad (7)$$

As is obvious from equation (7), the balance $CL_{BAL}$ is 0 if C11 and C22 or L11 and L22 are equal in magnitude, whereas the value of the balance $CL_{BAL}$ is large if C11 and C22 or L11 and L22 are poorly balanced in magnitude.

The relation between the balance $CL_{BAL}$ and the noise intensity of the common mode noise is illustrated in FIG. 13. The horizontal axis of FIG. 13 represents the value of the balance $CL_{BAL}$ while the vertical axis represents the noise intensity. The noise intensity exhibits such characteristics that the value of the balance $CL_{BAL}$ linearly increases after exceeding 1 and plateaus after reaching 2.5. The noise intensity can be low by setting the value of the balance $CL_{BAL}$ such that $CL_{BAL} \leq 2$. In other words, the power conversion device 5 can further reduce the common mode noise by making the value of the balance $CL_{BAL}$ small.

Note that leading the conductive member 14 from the center portion of the grounding member 13c has an importance in making the balance $CL_{BAL}$ small. That led portion is indicated by sign γ in FIG. 8. Leading the conductive member 14 from the center portion of the grounding member 13c contributes to making the magnitudes of C11 and C22 equal and making the magnitudes of L11 and L22 equal.

Fifth Embodiment

An example of the configuration of a power conversion device 6 in a fifth embodiment is illustrated in FIG. 14. The power conversion device 6 in this embodiment differs from the power conversion device 3 (FIG. 7) in that the conductive member 14 is constituted of two conductive members 14a, 14b.

The conductive members 14a and 14b are conductive lines of, for example, a flat plate shape. Using the two conductive members 14a, 14b makes it easier for the line-to-line capacitance (C11) between the first power-supply busbar 10 and the conductive member 14a and the line-to-line capacitance (C22) between the second power-supply busbar 11 and the conductive member 14b to be even.

In FIG. 15 is illustrated a cross-sectional view taken along the direction perpendicular to the direction of extension of each conductive line (10, 11, 14a, 14b) (corresponding to the B-B cross section in FIG. 14). As illustrated in FIG. 15, the cross-sectional shapes of the conductive members 14a, 14b, the first power-supply busbar 10, and the second power-supply busbar 11 are the same.

The conductive member 14a, the first power-supply busbar 10, the second power-supply busbar 11, and the conductive member 14b are horizontally arranged in this order while being spaced from each other in such a way as to form a single plane. Moreover, they are routed such that the distance between the conductive member 14a and the first power-supply busbar 10 and the distance between the conductive member 14b and the second power-supply busbar 11 are equal to each other.

By such routing, the capacitive coupling between the first power-supply busbar 10 and the conductive member 14a and the capacitive coupling between the second power-supply busbar 11 and the conductive member 14b can be made small. Moreover, by the effect of the mutual inductance M between each pair, the inductances of the conductive members 14a and 14b can be reduced.

By routing each conductive line as illustrated in FIG. 15, the values in the balance $CL_{BAL}$ are made even by small values. Consequently, the power conversion device 6 further reduces the noise intensity.

Alternatively, the conductive members 14a, 14b, the first power-supply busbar 10, and the second power-supply busbar 11 may be routed as illustrated in FIG. 16. With such routing, the power conversion device 6 utilizes the effect of the mutual inductance M more effectively.

The first power-supply busbar 10 and the second power-supply busbar 11 illustrated in FIG. 16 are conductive lines of a flat plate shape. One surface of the first power-supply busbar 10 faces the conductive member 14a and also faces the second power-supply busbar 11. One surface of the second power-supply busbar 11 faces the first power-supply busbar 10 and also faces the conductive member 14b.

With the first power-supply busbar 10 and the conductive member 14a facing each other and the second power-supply busbar 11 and the conductive member 14b facing each other as illustrated in FIG. 16, the mutual inductance M therebetween is made large (equation (5)). Consequently, with the effect of the mutual inductances M, the power conversion device 6 reduces the inductances of the conductive members 14a, 14b and therefore suppresses the radiation of unnecessary electromagnetic waves due to the common mode noise.

Meanwhile, in the case where the conductive member 14a, the first power-supply busbar 10, the second power-supply busbar 11, and the conductive member 14b are disposed on a single plane (FIG. 15), the conductive lines (10, 11, 14a, 14b) are advantageously routed to be equal to each other in distances from the housing 15. Specifically, the distance to each conductive line (10, 11, 14a, 14b) from the upper wall of the inside of the housing 15 is defined as y1, the distance to each conductive line (10, 11, 14a, 14b) from the lower wall of the inside of the housing 15 is defined as y2, the distance to the conductive member 14a from one side wall of the inside of the housing 15 is defined as x1, and the distance to the conductive member 14b from the opposite side wall of the inside of the housing 15 is defined as x2.

Then, the conductive lines (10, 11, 14a, 14b) are disposed at a center portion of the inside of the housing 15 by satisfying y1=y2 and x1=x2. Disposing the conductive lines (10, 11, 14a, 14b) at the center portion of the inside of the housing 15 balances the parasitic impedances generated between the conductive lines (10, 11, 14a, 14b) and the housing 15. This makes it possible to more effectively utilize the effect of making the value of the balance $CL_{BAL}$ small (FIG. 13).

The above applies also to the case of routing the conductive lines (10, 11, 14a, 14b) as illustrated in FIG. 16. The distances to the conductive members 14a and 14b from inner surfaces of the housing 15 are defined as y1 and x1, and the distances to the first power-supply busbar 10 and the second power-supply busbar 11 from inner surfaces of the housing 15 are defined as y1 and x2. Then, the difference between x1 and x2 is set to a distance sufficiently smaller than x1 (x2). In other words, the conductive lines (10, 11, 14a, 14b) are disposed at a center portion of the inside of the housing 15 by making the proportion of the difference sufficiently small. This makes it possible to make the value of the balance $CL_{BAL}$ small and therefore reduce the noise intensity of the common mode noise.

Sixth Embodiment

An example of the configuration of a power conversion device 7 in a sixth embodiment is illustrated in FIG. 17. The power conversion device 7 differs from the power conversion device 3 (FIG. 6) in that the length of the conductive member 14 in the power conversion device 3 is set to ¼ of a wavelength λ of a high-frequency signal with a common mode voltage (current) generated by opening and closing the switching elements 12a, 12b.

For the frequency of the high-frequency signal with the common mode voltage, there are two frequencies—the resonance frequency with the inductance component and the capacitance component of the above-mentioned first loop $R_1$ and second loop $R_2$, and the frequency of a standing wave generated at the surface of the cooling member 30 with the resonance frequency as a trigger. The power conversion device 7 reduces the noise intensity of the common mode noise by setting the length of the conductive member 14 to ¼ of the wavelength λ of the high-frequency signal with the common mode voltage.

The operation and advantageous effect of the conductive member 14 having the length of λ/4 will be described with reference to FIG. 18. Part (a) of FIG. 18 is a diagram schematically illustrating a propagation route for a common mode voltage Vn to reach the cooling member 30 through the conductive member 14. Part (b) of FIG. 18 is a diagram conceptually illustrating attenuation of the common mode voltage Vn.

As the common mode voltage Vn propagates to the cooling member 30, a standing wave corresponding to the size (dimensions) of the cooling member, indicated by a waveform δ (solid line), is generated. The standing wave propagates through the conductive member 14 and is reflected inside the conductive member 14. Then, by forming a branched channel with a length that is ¼ of the wavelength λ of the standing wave, a reflected wave of the reverse phase is generated in the conductive member 14, and the standing wave and the reflected wave cancel each other out, so that the standing wave is suppressed. In other words, by setting the length of the conductive member 14 to λ/4 of the wavelength λ of the standing wave generated at the cooling member 30, reflected waves cancel each other out, as illustrated by a waveform ε (broken line), so that the standing wave is suppressed.

Meanwhile, the length of the conductive member 14 may be set to ¼ of the wavelength λ of the resonance frequency with the inductance component and the capacitance component of the first loop $R_1$ and the second loop $R_2$. The high-frequency signal with the common mode voltage propagating through the first power-supply busbar 10 and the second power-supply busbar 11 is reflected inside the conductive member 14. Thus, as in the above-described standing wave, the common mode noise can be suppressed by setting the length of the conductive member 14 to λ/4 of the wavelength λ of the frequency of the high-frequency signal with the common mode voltage.

As described above, the length of the conductive member 14 may be either ¼ of the wavelength λ of the resonance frequency with the inductance component and the capacitance component of the first loop $R_1$ and the second loop $R_2$ or ¼ of the wavelength λ of the frequency of the standing wave generated at the surface of the cooling member 30. In sum, the wavelength λ may just be a wavelength corresponding to the frequency of the common mode noise generated by opening and closing the switching elements. Meanwhile, with the wavelength λ and an odd number n, similar operation and advantageous effect can be achieved by setting the length of the conductive member 14 to nλ/4.

As described above, the embodiments can achieve the following operations and advantageous effects.

Since the conductive member 14 is routed along at least one of the first power-supply busbar 10 and the second power-supply busbar 11, the inductance of the conductive member 14 can be reduced by the effect of the mutual inductance M between the conductive member 14 and the first power-supply busbar 10 or the second power-supply busbar 11. Thus, the impedance of the conductive member 14 decreases, allowing a common mode current to flow preferentially through the conductive member 14 and reducing the common mode current leaking to the housing 15. Consequently, the power conversion device 1 suppresses the radiation of unnecessary electromagnetic waves due to the common mode noise and does therefore not adversely affect the operations of peripheral electronic devices.

Also, the power conversion device 3, which includes the cooling member 30, has the conductive member 14 connected to the portion 30a of the cooling member 30, which is grounded. This eliminates the need for a member only for ensuring the ground potential for the conductive member 14. In other words, the power conversion device 3 offers the advantage of reducing the common mode current and also the advantage of making it easier to ensure the ground potential.

Also, the power conversion device 3, which includes the cooling member 30, can shorten the length of the conductive member 14 by the thickness of the cooling member 30. Specifically, the length of the conductive member 14 can be made shorter than the length of the channel reaching the portion 30a from the grounding member 13c through the housing 15. Accordingly, the impedance of the conductive member 14 decreases, allowing a common mode current to flow preferentially through the conductive member 14 and reducing the common mode current leaking to the housing 15.

Also, in the power conversion device 4, the inductances of the grounding member 13c, the conductive member 14, and the housing 15 are set to L1, L2, L3, respectively. The power conversion device 4 reduces the common mode current leaking to the housing 15 by making the inductance L2 of the conductive member 14 smaller than the sum of the inductances of the grounding member 13c and the housing 15 (L1+L3).

Also, the power conversion device 5, in which the capacitor $C_b$ floats between the grounding member 13c and the housing 15, reduces the leakage of the common mode current in a particular frequency band to the housing 15 by satisfying the above-mentioned inequality (6).

Also, the power conversion device 5, configured such that the shape of each conductive line is a flat plate shape, and the first power-supply busbar 10 and the second power-supply busbar 11 are each routed with its one surface facing one surface of the conductive member 14, can make the balance $CL_{BAL}$ in electrical properties small, the balance $CL_{BAL}$ being calculable using the impedances of the conductive lines. Consequently, the power conversion device 5 can make the noise intensity of the common mode noise low (FIG. 12).

Also, in the case where the conductive member 14 is constituted of the two conductive members 14a, 14b, the mutual inductances M between the conductive members 14a, 14b and the first power-supply busbar 10 and second power-supply busbar 11 can be made large. Consequently, the power conversion device 6 reduces the inductances of the conductive members 14a, 14b with the effect of the mutual inductances M.

Also, by setting the length of the conductive member 14 to $n\lambda/4$ of the wavelength $\lambda$ of the common mode noise generated by opening and closing the switches of the power module 12, reflected waves cancel each other out. Hence, the noise intensity of the common mode noise can be reduced.

Although the content of the present invention has been described above along embodiments, it is obvious to those skilled in the art that the present invention is not limited to these descriptions but various changes and modifications are possible.

For example, the embodiment that effectively utilizes the effect of the mutual inductance M by using the two conductive members 14a, 14b may be applied to any of the above-described power conversion devices 1 to 5. Also the embodiment that sets the length of the conductive member 14 to $n\lambda/4$ of the wavelength $\lambda$ of the high-frequency signal with the common mode voltage (current) may be applied to any of the power conversion devices 1 to 6.

The above-described embodiments of the present invention can be applied to inverters and converters and widely utilized for power conversion devices in applications that require suppression of radiation of unnecessary electromagnetic waves.

REFERENCE SIGNS LIST 1, 2, 3, 4, 5, 6, 7 power conversion device
10 first power-supply busbar
11 second power-supply busbar
12 power module
12a, 12b switching element
13a first capacitor
13b second capacitor
13c grounding member
14 conductive member
15 housing
16 power source
30 cooling member
30a portion

The invention claimed is:

1. A power conversion device comprising:
a first power-supply busbar arranged from a positive electrode side of a power source;
a second power-supply busbar arranged from a negative electrode side of the power source;
a switching element provided between the first power-supply busbar and the second power-supply busbar;
a first capacitor with one end thereof connected to the first power-supply busbar;
a second capacitor with one end thereof connected to the second power-supply busbar;
a grounding member directly connected to each of an opposite end of the first capacitor and an opposite end of the second capacitor and electrically connected to a ground potential; and
a conductive member routed along at least one of the first power-supply busbar or the second power-supply busbar and directly connecting the grounding member and the ground potential,
wherein the switching element converts an output of the power source.

2. The power conversion device according to claim 1, comprising a cooling member that cools the switching element,
wherein a surface of the cooling member is grounded, and the cooling member includes a portion on the surface to which the conductive member is connected.

3. The power conversion device according to claim 2, comprising:
a housing to which the cooling member is fixed; and
a ground potential member connecting the grounding member and the housing,
wherein a length of the conductive member is shorter than the shortest distance from the grounding member to the portion through the housing.

4. The power conversion device according to claim 1, wherein the conductive member is routed such that a line-to-line capacitance between the first power-supply busbar and the conductive member and a line-to-line capacitance between the second power-supply busbar and the conductive member are even.

5. The power conversion device according to claim 1, wherein the conductive member is routed such that a distance between the first power-supply busbar and the conductive member and a distance between the second power-supply busbar and the conductive member are equal.

6. The power conversion device according to claim 1, wherein
the conductive member is two conductive lines of a flat plate shape,
the first power-supply busbar is a conductive line of a flat plate shape, and faces one of the conductive lines of the conductive member while also facing the second power-supply busbar with a same surface thereof facing the conductive member, and
the second power-supply busbar is a conductive line of a flat plate shape, and faces the other conductive line of the conductive member with a same surface thereof facing the first power-supply busbar.

7. The power conversion device according to claim 1, wherein a length of the conductive member is $n\lambda/4$, where $\lambda$ is a wavelength of a common mode noise generated by opening and closing the switching element, and n is an odd number.

8. The power conversion device according to claim 1, wherein the power source is a single power source.

9. The power conversion device according to claim 1, wherein a common current flows through the first power-supply busbar and the second power-supply busbar simultaneously.

* * * * *